Figure 3:
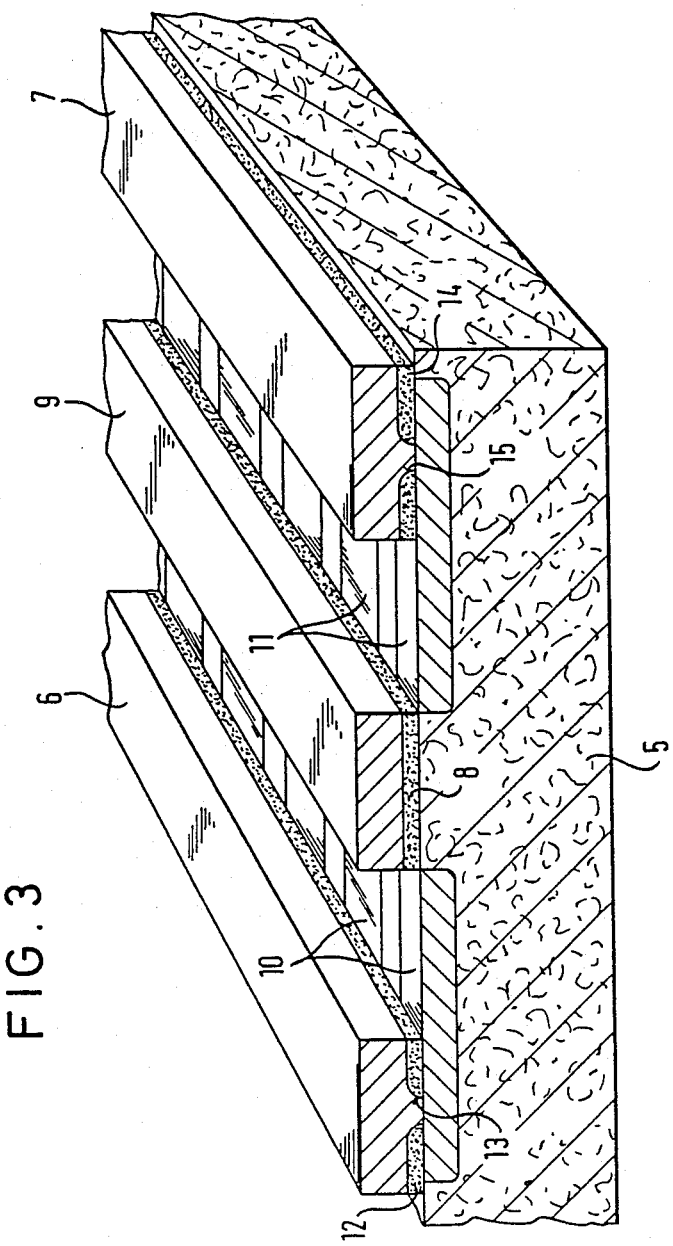

United States Patent [19]

Heinecke et al.

[11] Patent Number: 4,845,536
[45] Date of Patent: Jul. 4, 1989

[54] TRANSISTOR STRUCTURE

[75] Inventors: Guenter Heinecke, Pfannenstiel; Lembit Soobik, Sonnenstrasse, both of Fed. Rep. of Germany

[73] Assignee: Texas Instruments Incorporated, Dallas, Tex.

[21] Appl. No.: 88,512

[22] Filed: Aug. 20, 1987

Related U.S. Application Data

[63] Continuation of Ser. No. 32,927, Mar. 27, 1987, abandoned.

[30] Foreign Application Priority Data

Dec. 22, 1983 [DE] Fed. Rep. of Germany ....... 3346518

[51] Int. Cl.$^4$ ............................................. H01L 29/78
[52] U.S. Cl. .................................. 357/23.1; 357/23.8; 357/23.13; 357/41
[58] Field of Search ...................... 357/23.1, 23.13, 41, 357/23.8

[56] References Cited

U.S. PATENT DOCUMENTS 3,394,268  7/1968  Murphy .
3,775,623 12/1973  Kamiyama .
4,053,916 10/1977  Cricchi ................................ 357/23.7
4,202,005  5/1980  Sanders ................................ 357/36
4,287,433  9/1981  Goodspeed .
4,306,246 12/1981  Davies et al. .
4,344,080  8/1982  Siemen's AG .
4,486,674 12/1984  Neely .

FOREIGN PATENT DOCUMENTS 0169782  7/1985  European Pat. Off. .
1044469  9/1966  United Kingdom .

OTHER PUBLICATIONS

IBM Technical Disclosure Bulletin, vol. 24, No. 1B, Jun. 1981, pp. 864, 865, New York; P. W. Betz et al.
Patents Abstracts of Japan, vol. 6, No. 140, (E-121), (1018), Jun. 29th, 1982; & JP-A-57 63 861, (Nippon Denki, KK).
IBM Technical Disclosure Bulletin, vol. 8, No. 2, Jul. 1965, pp. 317–318, New York, U.S. L. W. Atwood.
Patents Abstracts of Japan, vol. 8, No. 243, (E-277), [1680], Nov. 8th, 1984, (Fujitsu K.K.).
Patents Abstracts of Japan, vol. 4, No. 141, (E-28), [623], Oct. 4th, 1980, (Fujitsu K.K.).
Patents Abstracts of Japan, vol. 5, No. 15, (E-43), [687], Jan. 29th, 1981, (Nippon Denki K.K.).

Primary Examiner—Andrew J. James
Assistant Examiner—Mark Prenty
Attorney, Agent, or Firm—Gary C. Honeycutt; Melvin Sharp; N. Rhys Merrett

[57] ABSTRACT

The invention relates to a field-effect transistor (1;20) with insulated gate electrode (9;30) which comprises in a semiconductor body (5) a drain diffusion zone (2) connected to a drain electrode (6;32) and a source diffusion zone (3) which is disposed spaced from the drain diffusion zone (2) for forming a channel zone (4) and which is connected to a source electrode (7). The gate electrode (9;32) of said field-effect transistor is disposed on a gate insulating layer (8) over the channel zone (4). For protecting the transistor against high voltages produced by electrostatic charging the drain diffusion zone (2) of the transistor and/or the source diffusion zone (3) between the respective associated electrode (6,7;32) and the channel zone (4) is divided into a plurality of parallel strips (10,11). Integrated circuits are also protected against destruction by high voltages if the insulated gate field-effect transistors connected to their output terminals are constructed in the manner outlined above.

4 Claims, 4 Drawing Sheets

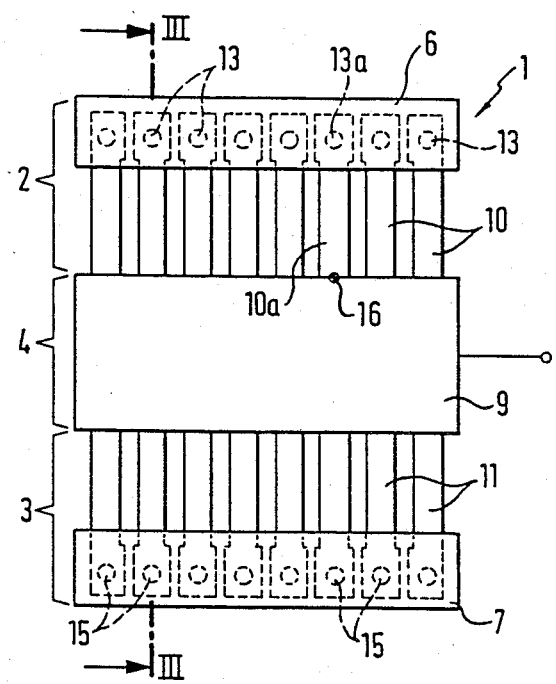
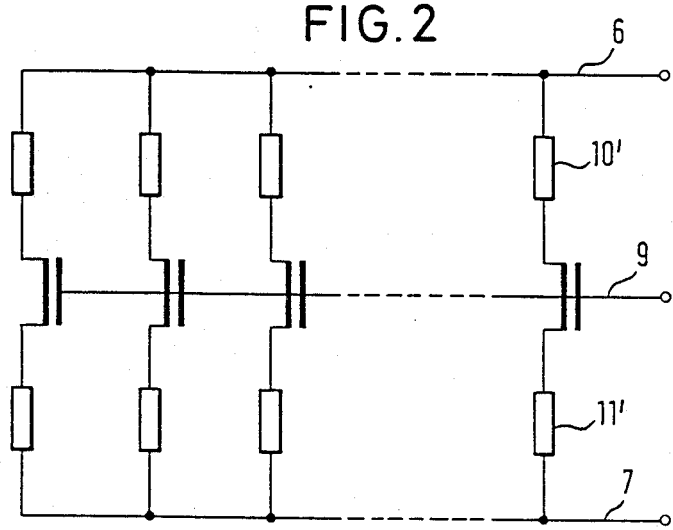

TRANSISTOR STRUCTURE

This application is a continuation, of application Ser. No. 32,927, filed Mar. 27, 1987, now abandoned.

The invention relates to a field-effect transistor with insulated gate electrode which comprises in a semiconductor body a drain diffusion zone connected to a drain electrode and a source diffusion zone which is disposed spaced from the drain diffusion zone for forming a channel zone and which is connected to a source electrode, the gate electrode being disposed on a gate insulating layer over the channel zone.

Field-effect transistors with insulated gate electrode which are usually also referred to as MIS or MOS field-effect transistors are being increasingly used in electronic circuits and in particular in integrated semiconductor circuits. It is known that such field-effect transistors are very sensitive to high voltages because the insulating layer between the gate electrode and the surface of the semiconductor body in which the source and drain diffusion zones are disposed is extremely thin and consequently easily breaks down when high voltages occur between the gate electrode and the semiconductor body. Irreversible destruction of the insulating layer can occur at voltages as low as 80 or 100V. Voltages of such values and even substantially higher values can arise by electrostatic charging and unintentionally reach the terminals of the transistors when the latter are manipulated. The sensitivity to high voltages is particularly disadvantageous in cases where field-effect transistors are used as input or output transistors in integrated circuits because on destruction of the field-effect transistor connected to the input terminal or the output terminal the entire integrated circuit becomes unuseable.

To protect the field-effect transistors with insulated gate electrode connected to the input terminals of integrated circuits circuit combinations of resistors, zener diodes and transistors connected to the respective input terminal have been used, which carry overvoltages occurring at the input terminal to ground so that the insulated gate field-effect transistor connected to the input terminal is protected. The insulated gate field-effect transistors connected to output terminals were protected hitherto by inserting a series resistor between the field-effect transistor and the output terminal. This series resistor effected a limitation of the current flowing on unintentional application of an overvoltage to a value which did not destroy the transistor. However, such a series resistor cannot be used in all circuits because it also limits the useful current furnished by the circuit. In addition, it prevents signals with high frequency from being emitted with the output transistor of the circuit because with the capacitances effective at the output terminal it defines a relatively low limit frequency.

The problem underlying the invention is to construct an insulated gate field-effect transistor of the type outlined at the beginning such that it is reliably protected from overvoltages without disadvantageous effects on the current it can furnish and the switching frequency which can be achieved therewith.

According to the invention this is solved in that the drain diffusion zone and/or the source diffusion zone between the respective associated electrode and the channel zone is divided into a plurality of parallel strips.

In the field-effect transistor according to the invention the parallel strips form series resistances which because they are connected in parallel have no disadvantageous effects on the overall behaviour of the field-effect transistor. When such a field-effect transistor is subjected to an overvoltage produced by electrostatic charging a breakdown of the barrier layer between the source and/or the drain diffusion zone and the substrate begins. The electrostatic charge produces at the breakdown point a current which flows through the strip of the diffusion zone lying nearest to the breakdown point. The strip forms a series resistance which limits the current flowing to the breakdown point and across which at the same time a voltage drop occurs. The series resistance formed by the strip prevents an increase of the current at the breakdown point to a value which results in irreversible thermal destruction of the insulating layer. The voltage drop across the series resistance is so high that individual breakdowns can also occur at other points of the barrier layer so that a distribution of the current resulting from the electrostatic charging to several breakdown points takes place. Because of the resulting current distribution the breakdowns do not lead to thermal destruction of the insulating layer because the current fractions flowing at the breakdown points can no longer heat the insulating layer to destruction. At the same time, this limits the rise of the voltage at the diffusion zones to values which lie beneath the punch-through voltage of the insulating layer. In considering this mode of operation it should be remembered that the application of an overvoltage produced by electrostatic charging to the field-effect transistor is comparable to the application of a charged capacitor. This means that without provision of a current limitation the voltage applied would very rapidly break down on a great increase in the current. By dividing the drain diffusion zone and/or the source diffusion zone into individual strips series resistances are incorporated into the discharge path which prevent the great increase in the current leading to destruction and the rapid breaking down of the voltage.

Advantageous further developments of the invention are characterized in the subsidiary claims.

Figure 4:
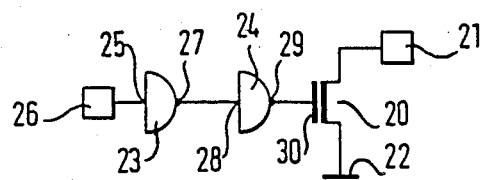
Figure 5:
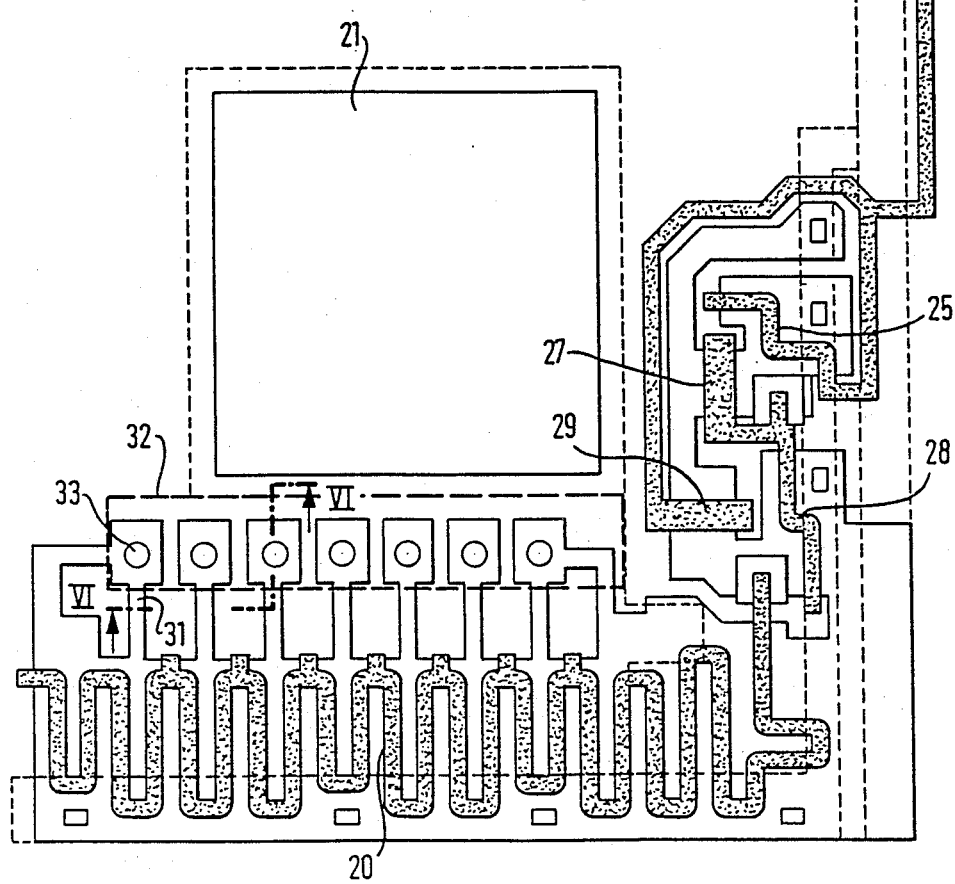
Figure 6:
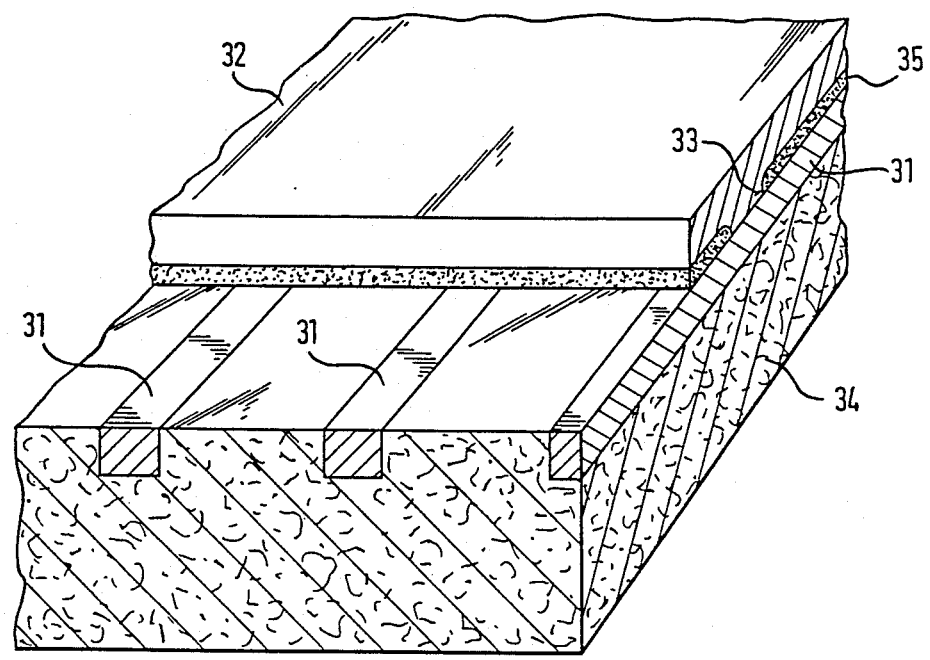

The invention will now be explained by way of example with reference to the drawings, wherein:

FIG. 1 is a schematic plan view of an insulated gate field-effect transistor according to the invention formed on a semiconductor body, FIG. 2 is an equivalent circuit diagram of the field-effect transistor according to the invention, FIG. 3 is a perspectively widened section along the line III—III of FIG. 1, FIG. 4 is a circuit diagram of an output stage including an insulated gate field-effect transistor according to the invention, FIG. 5 is a greatly enlarged plan view of a semiconductor body in which the circuit of FIG. 4 is realized in the form of an integrated circuit, and FIG. 6 is a perspectively widened section along the line VI—VI of FIG. 5.

In FIG. 1 a field-effect transistor 1 is shown diagramatically in plan view. It includes a drain diffusion zone 2 and source diffusion zone 3. These two zones are arranged in spaced relationship; between them lies the channel zone 4. The drain diffusion zone 2 and the source diffusion zone 3 are formed in the surface of a semiconductor body 5 which can be seen in the section view of FIG. 3. Over the end of the drain diffusion zone 2 remote from the channel zone 4 a drain electrode 6 formed by a metal layer is disposed; in the same manner, a source electrode 7 consisting of metal is disposed above the end of the source zone 3 remote from the channel zone 4.

In the region of the channel zone 4 on the surface of the semiconductor body 5 an insulating layer 8 is disposed on which there is a gate electrode 9 consisting of metal or polycrystalline silicon. As apparent from the plan view of FIG. 1 both the drain diffusion zone 2 and the source diffusion zone 3 are divided into individual parallel strips 10 and 11 respectively. The drain electrode 6 is not disposed directly on the drain diffusion zone 2 but is on an insulating layer 12 and is in connection with the individual strips 10 via contact windows 13 formed in said insulating layer 12. Likewise, the source electrode 7 is also formed on an insulating layer 14 and in connection with the strips 11 via contact windows 15 in said insulating layer 14. In the sectional view of FIG. 3 the insulating layers 12 and 14 and the associated contact windows 13 and 15 can be seen.

The semiconductor body 5 consists for example of P-conductive material and the strips 10 and 11 can be formed from $N^+$-conductive material using known diffusion methods. In such a field-effect transistor by applying a positive voltage to the gate electrode 9 an N-conducting channel can be formed beneath the insulating layer 8.

FIG. 2 shows an equivalent circuit diagram of the field-effect transistor illustrated in FIG. 1. As is apparent, the field-effect transistor 1 of FIG. 1 can be considered as if it were formed from a parallel connection of as many field-effect transistors as there are parallel strips 10, 11 in the drain diffusion zone 2 or the source diffusion zone 3. The strips 10, 11 behave like series resistances 10', 11' which are inserted in the drain or source lines of the individual field-effect transistors. Since all these resistances are connected in parallel their total resistance is very small and consequently they do not have any appreciable effects on the overall behaviour of the field-effect transistor 1.

It will now be assumed that a high voltage produced by electrostatic charging reaches the drain electrode 6. Such a high voltage, which can have values of 1000V or more, leads in the very thin insulating layer 8 beneath the gate electrode 9 to extremely high field strengths which can produce a punch-through of the insulating layer 8. Even at voltage values beneath this punch-through voltage value a breakdown of the barrier layer between the drain diffusion zone and the substrate begins at a breakdown point 16. The current flowing through this breakdown point 16 flows to the source diffusion zone. It cannot be predicted where the breakdown point 16 will form; the location of this point depends for example on irregularities in the geometry of the transistor structure. If the diffusion zone 2 is not divided into individual strips as in the field-effect transistor 1 current begins to flow at the barrier layer breakdown point 16 and very rapidly assumes high values because the resistance at the breakdown point becomes very small. With the rise of the current the temperature at the breakdown point rapidly rises until finally the insulating layer 8 is destroyed. With the current rise the voltage rapidly collapses because the source supplying voltage produced by electrostatic charging is comparable to a charged capacitor and on discharge behaves exactly like the latter.

If however the drain diffusion zone 2 is divided into individual strips the discharge current from the drain electrode 16 can flow only via the contact window 13a and through the strip 10a to the breakdown point 16. As already mentioned, the strip 10a behaves like a series resistance which limits the current flowing to the breakdown point 16. The series resistance formed by the strip 10a prevents a rapid collapse of the voltage applied and the voltage drop across the series resistance is so high that barrier layer breakdowns can also occur in the region of other strips 10. Due to the multiple breakdowns the total current is divided into individual current fractions so that the currents flowing at the individual breakdown points can no longer become large enough for irreversible thermal destruction of the insulating layer 8. The energy supplied from the source of the static charging can thus be converted to heat at several locations without destroying the field-effect transistor.

FIG. 4 shows a circuit diagram of an insulated gate field-effect transistor 20 which is used in the circuit illustrated as output transistor. Its drain electrode is connected to an output terminal 21 shown as quadrangular contact surface. The source electrode of the field-effect transistor 20 is applied to ground. The field-effect transistor 20 is driven via two negators 23 and 24. The input 25 of the negator 23 is connected to the input terminal 26. The output 27 of the negator 23 is connected to the input 28 of the negator 24 whose output 29 is directly connected to the gate electrode 30 of the field-effect transistor 20.

FIG. 5 shows in a plan view of a semiconductor body how the circuit of FIG. 4 is realized in said semiconductor body. The same reference numerals as in FIG. 4 are used to enable the components illustrated in the circuit diagram to be associated with the components illustrated in FIG. 5.

It is apparent from the plan view of FIG. 5 that the drain diffusion zone is divided into individual strips 31 so that as in the field-effect transistor of FIG. 1 between the region of the drain electrode and the region of the gate electrode individual parallel series resistances are formed which provide the protection explained above against high voltages. The drain electrode 32 is represented in FIG. 5 by a rectangle surrounded by a dashed line. The connection between the drain electrode 32 and the drain diffusion zone is established via contact windows 33.

In the perspectively expanded illustration of FIG. 6 the semiconductor body 34 can also be seen on which the negated circuit is formed. The insulating layer 35 between the drain diffusion zone and the drain electrode 32 is also apparent.

In the integrated circuit of FIG. 5 the source diffusion zone is not divided into individual strips because it has been found that the division of the drain diffusion zone itself provides adequate protection against high voltages. Should it be found necessary in some cases to divide the source diffusion zone into strips as well the field-effect transistor 20 could of course also be constructed in the manner of the field-effect transistor 1 of FIG. 1.

We claim:

1. A field effect transistor having an insulated gate electrode on a semiconductor body, said body including a drain diffusion zone connected to a drain electrode, a source diffusion zone spaced from said drain diffusion zone to define a channel zone, and a source electrode connected to said source diffusion zone, each of said source and drain diffusion zones comprising a plurality of separated parallel strips extending from the channel zone to said source and drain electrodes, respectively.

2. A transistor according to claim 1, wherein said gate electrode is doped polysilicon.

3. A transistor according to claim 1, wherein each of said source and drain electrodes is a metal lead.

4. A transistor according to claim 1, wherein said channel is doped N-type and said source and drain are P-type.

* * * * *